T861015

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specification, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED APRIL 8, 1969

861 O.G. 367

766,370

PHOTOSENSITIVE MATERIALS AND METHODS

Gordon C. Newland, Kingsport, Tenn., assignor to Eastman Kodak Company, Rochester, N.Y., a corporation of New Jersey

Continuation of application Ser. No. 479,288, Aug. 12, 1965. This application Sept. 25, 1968. Published Apr. 8, 1969

Class 96—48

No Drawing. 32 Pages Specification

Color changes are produced in photosensitive polyolefin materials by exposing the material to actinic radiation and then reacting the material with a color-producing agent such as a sulfur containing compound or a basic dye. The photosensitive polyolefin preferably contains one or more photosensitizers. Typical photosensitizers are benzophenones, N-phenylacridones, 4-quinolizones, 4,4″-oxydibenzophenones, acetamidoethyl-3′-nitrobenzils, and titanium dioxide.